(12) United States Patent
Kirloskar et al.

(10) Patent No.: US 6,221,749 B1
(45) Date of Patent: Apr. 24, 2001

(54) SEMICONDUCTOR DEVICE AND PRODUCTION THEREOF

(75) Inventors: Mohan Kirloskar, Cupertino, CA (US); Michio Horiuchi; Yukiharu Takeuchi, both of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/388,080

(22) Filed: Aug. 31, 1999

(30) Foreign Application Priority Data

Sep. 2, 1998 (JP) .................................................. 10-248146

(51) Int. Cl.[7] .................................................. H01L 21/44
(52) U.S. Cl. ........................................... 438/611; 438/461
(58) Field of Search ....................... 29/840, 845; 438/117, 438/111, 667, 455, 464, 611, 461, 411

(56) References Cited

U.S. PATENT DOCUMENTS

| 5,476,211 | 12/1995 | Khandros | 228/180.5 |
| 5,974,662 | * 11/1999 | Eldridge et al. | 29/842 |
| 6,033,935 | * 5/2000 | Dozier, II et al. | 438/117 |

FOREIGN PATENT DOCUMENTS

| 61-104630 | 6/1986 | (JP) . |
| 64-50539 | 2/1989 | (JP) . |
| 5-90338 | 4/1993 | (JP) . |
| 7-1773 | 1/1995 | (JP) . |

* cited by examiner

Primary Examiner—Matthew Smith
Assistant Examiner—Calvin Lee
(74) Attorney, Agent, or Firm—Pennie & Edmonds LLP

(57) ABSTRACT

A semiconductor device comprising a semiconductor chip having an electrode terminal carrying surface and electrode terminals formed on, and carried by, the electrode terminal carrying surface; leads extending substantially parallel to the electrode terminal carrying surface and each having at least one curved portion; a first bump and a second bump which are formed on one and the other ends, respectively, of each of the leads and protrude from the ends in opposite directions toward and away from, respectively, the electrode terminal carrying surface; and the electrode terminals of the semiconductor chip each being bonded to a top of the first bump of the lead to support the leads at a distance from the electrode terminal carrying surface of the semiconductor chip. A process of producing the semiconductor device a dissolvable metal sheet suitably used in the process and a process of producing the metal sheet are also provided.

20 Claims, 9 Drawing Sheets

SEMICONDUCTOR DEVICE AND PRODUCTION THEREOF

BACKGROUND OF THE INVENTION

1. Field of the Invention

The present invention relates to a semiconductor device produced in substantially the same size as the semiconductor chip packaged therein, a process of producing the semiconductor device, a dissolvable metal sheet to be used in the process, and a process for producing the metal sheet.

2. Description of the Related Art

Figure 1:
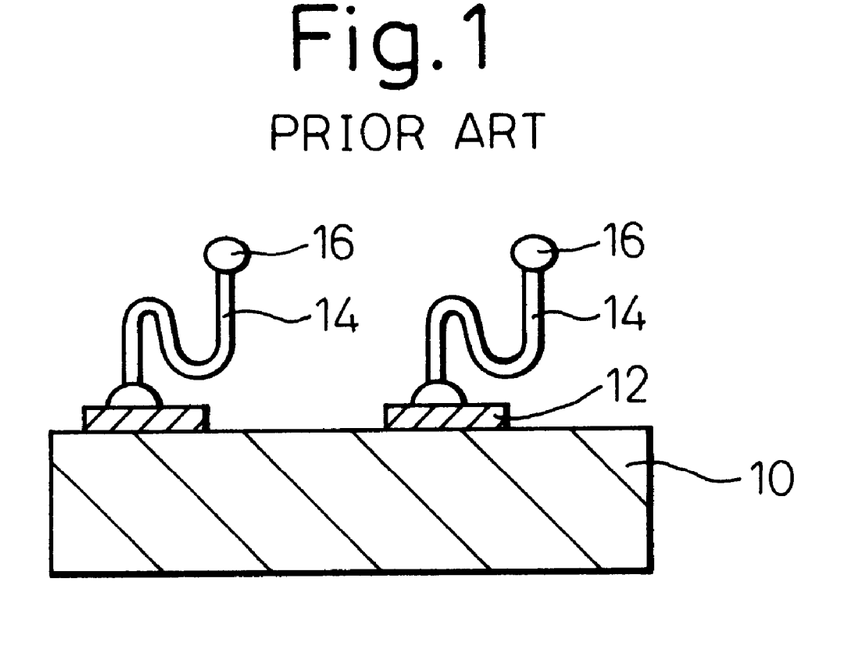
FIG. 1 is a cross-sectional view of a prior art semiconductor device having a lead structure using a wire.

As shown in FIG. 1, U.S. Pat. No. 5,476,211 discloses a chip size package (CSP) or a semiconductor device produced in substantially the same size as the semiconductor chip packaged therein, in which a semiconductor chip 10 has an electrode terminal carrying surface on which electrode terminals formed on an extension of the electrode terminals are formed and carried and an S-shaped wire 14 is bonded to the electrode terminal. The wire 14 is bonded on one end to the electrode terminal 12 by wire bonding, worked to an S-shape, and then cut on the other hand at a selected height. The cut end or the free tip of the wire 14 is bonded to terminals of a mother board to mount the chip 10 on the mother board, during which the S-shaped wire 14 absorbs the thermal or other stresses. The wire 14 may have a plated coating thereon, for strengthening, to maintain the initial S-shape during processing.

The prior art semiconductor device provides a simple structure enabling a chip size package to be produced using no interposers to support lead assemblies while mitigating thermal stress.

However, the prior art structure has the following problems.

First, the wires 14 must be individually bonded to the electrode terminals 12 and worked to the S-shape to form each lead assembly, which process limits improvement in the productivity and raises the production cost.

It is also technologically difficult to stably form an S-shape by wire bonding process and to provide a constant height of the tip 16.

Wire bonding of the wire 14 may damage an active surface of the semiconductor chip 10.

Plating of the wire 14 may cause a short-circuit to occur in the conductor wiring pattern formed on the surface of the semiconductor chip 10. This is because the electrode terminals 12 formed on an electrode terminal carrying surface of the semiconductor chip 10 are electrically connected to the semiconductor chip 10 via a conductor wiring pattern formed on a passivation film, in which the conductor wiring is not covered by the passivation film and is at a high density.

SUMMARY OF THE INVENTION

An object of the present invention is to provide a semiconductor device having a lead assembly formed directly on a semiconductor chip packaged therein, in which the lead assembly has a structure for effectively mitigating stresses and can be produced efficiently and stably and also, to provide a process of producing the semiconductor device.

Another object of the present invention is to provide a dissolvable metal sheet to be used in the process and, also, to provide a process of producing the metal sheet.

To achieve the object according to the present invention, there is provided a semiconductor device comprising:

a semiconductor chip having an electrode terminal carrying surface and electrode terminals formed on, and carried by, the electrode terminal carrying surface;

leads extending substantially parallel to the electrode terminal carrying surface and each having at least one curved portion;

a first bump and a second bump which are formed on one and the other ends, respectively, of each of the leads and protrude from the ends in opposite directions toward and away from, respectively, the electrode terminal carrying surface; and the electrode terminals of the semiconductor chip each being bonded to a top of the first bump of the lead to support the leads at a distance from the electrode terminal carrying surface of the semiconductor chip.

Typically, the first bump of the lead forms an electrode connection terminal for connecting the electrode terminal of the semiconductor chip to the lead and the second bump of the lead forms an external connection terminal for connecting the lead to an external circuit.

The electrode terminals of the semiconductor chip may each have an extension lying on the electrode terminal carrying surface and a terminal to which the first bump of the lead is bonded.

In a preferred embodiment, the first bump forming the electrode connection terminal, the lead, and the second bump forming the external connection terminal are composed of a plated deposit of gold.

In another preferred embodiment, the first bump forming the electrode connection terminal and the lead are composed of a plated deposit of gold and the second bump forming the external connection terminal is composed of a low melting point metal.

Preferably, each lead extends a distance smaller than a pitch at which the electrode terminals are formed on the electrode terminal carrying surface of the semiconductor chip.

According to the present invention, there is also provided a dissolvable metal sheet suitably applicable to production of semiconductor devices, comprising:

a dissolvable metal substrate having concavities on one side in positions corresponding to those of electrode terminals of a semiconductor chip or a semiconductor wafer;

leads lying on said one side of the substrate and each having at least one curved portion, a first connection terminal on one end and a second connection terminal on the other end, the first and second connection terminals protruding in opposite directions from said one side of the substrate, the first connection terminals filling the concavities of the substrate, the second connection terminals having a height greater than that of the leads; and the dissolvable metal substrate being dissolvable by an etchant which does not dissolve the leads and the first and second terminals.

In a preferred embodiment, the leads and the first and second connection terminals are composed of a plated deposit of gold.

In another preferred embodiment, the leads and the second connection terminals are composed of a plated deposit of gold and the first connection terminals are composed of plural layers of different metals selected from the group consisting of gold, palladium, and nickel.

According to the present invention, there is also provided a dissolvable metal sheet suitably applicable to production of semiconductor devices, comprising:

a dissolvable metal substrate having throughholes extending therethrough in positions corresponding to those of electrode terminals of a semiconductor chip or a semiconductor wafer;

leads formed on one side of the substrate and each having at least one curved portion, a first connection terminal on one end and a second connection terminal on the other end, the first and second connection terminals protruding in opposite directions from said one side of the substrate, the first connection terminals filling the throughholes of the substrate, the second connection terminals having a height greater than that of the leads; and the dissolvable metal substrate being dissolvable by an etchant which does not dissolve the leads and the first and second terminals.

According to the present invention, there is also provided a process of producing a dissolvable metal sheet suitably applicable to production of semiconductor devices, comprising the steps of:

forming, on one side of a dissolvable metal substrate, concavities in positions corresponding to those of electrode terminals of a semiconductor chip or a semiconductor wafer;

filling the concavities with a plated deposit of a metal;

forming leads on said one side of the substrate, said leads lying on said one side of the substrate and each having at least one curved portion and bonded on one end to the plated deposit; and forming, on the other end of the leads, a plated deposit of a metal having a height greater than that of the leads.

According to the present invention, there is also provided a process of producing a dissolvable metal sheet suitably applicable to production of semiconductor devices, comprising the steps of:

forming throughholes extending through a dissolvable metal substrate in positions corresponding to those of electrode terminals of a semiconductor chip or a semiconductor wafer;

filling the throughholes with a low melting point metal;

forming leads on one side of the substrate, said leads lying on said one side of the substrate and each having at least one curved portion and bonded on one end to the low melting point metal filled in the throughholes; and forming, on the other end of the leads, a plated deposit of a metal having a height greater than that of the leads.

According to the present invention, there is also provided a process for producing a semiconductor device, comprising the steps of:

preparing a dissolvable metal sheet including a dissolvable metal substrate having concavities on one side in positions corresponding to those of electrode terminals formed on an electrode terminal carrying surface of a semiconductor chip or a semiconductor wafer; and leads lying on said one side of the substrate and each having at least one curved portion, a first connection terminal on one end and a second connection terminal on the other end, the first and second connection terminals protruding in opposite directions from said one side of the substrate, the first connection terminals filling the concavities of the substrate, the second connection terminals having a height greater than that of the leads; the dissolvable metal substrate being dissolvable by an etchant which does not dissolve the leads and the first and second terminals;

placing the metal substrate with said one side being substantially parallel to said electrode terminal carrying surface of the semiconductor chip or the semiconductor wafer and with the second connection terminals being in an aligned contact with said electrode terminals;

bonding the second connection terminals to the electrode terminals;

entirely removing the metal substrate by dissolution with an etchant to expose lead assemblies each composed of the lead having on said one end the first connection terminal forming an external connection terminal and, on said other end, the second connection terminal forming an electrode connection terminal bonded to the electrode terminal to support the lead at a distance from and substantially parallel to said electrode terminal carrying surface of the semiconductor chip or the semiconductor wafer.

According to the present invention, there is also provided a process for producing a semiconductor device, comprising the steps of:

preparing a dissolvable metal sheet including a dissolvable metal substrate having concavities on one side in positions corresponding to those of electrode terminals formed on an electrode terminal carrying surface of a semiconductor chip or a semiconductor wafer; and leads lying on said one side of the substrate and each having at least one curved portion, a first connection terminal on one end and a second connection terminal on the other end, the first and second connection terminals protruding in opposite directions from said one side of the substrate, the first connection terminals filling the concavities of the substrate, the second connection terminals having a height greater than that of the leads; the dissolvable metal substrate being dissolvable by an etchant which does not dissolve the leads and the first and second terminals;

partially removing the metal substrate by dissolution with an etchant from the other side of the substrate until the first connection terminals are partially exposed;

placing the metal substrate with said one side being substantially parallel to said electrode terminal carrying surface of the semiconductor chip or the semiconductor wafer and with the partially exposed first connection terminals being in an aligned contact with said electrode terminals;

bonding the first connection terminals to the electrode terminals; and entirely removing the metal substrate by further dissolution with an etchant to expose lead assemblies each composed of the lead having on said one end the first connection terminal forming an electrode connection terminal bonded to the electrode terminal to support the lead at a distance from and substantially parallel to said electrode terminal carrying surface of the semiconductor chip or the semiconductor wafer and, on said other end, the second connection terminal forming an external connection terminal.

According to the present invention, there is also provided a process for producing a semiconductor device, comprising the steps of:

preparing a dissolvable metal sheet including a dissolvable metal substrate having throughholes extending therethrough in positions corresponding to those of electrode terminals of a semiconductor chip or a semiconductor wafer; leads formed on one side of the substrate and each having at least one curved portion, a first connection terminal on one end and a second connection terminal on the other end, the first and second connection terminals protruding in opposite directions from said one side of the substrate, the first connection terminals filling the throughholes of the substrate, the second connection terminals having a height greater than that of the leads; and the dissolvable metal substrate being dissolvable by an etchant which does not dissolve the leads and the first and second terminals;

placing the metal substrate with said one side thereof being substantially parallel to said electrode terminal carrying surface of said semiconductor chip or the semiconductor wafer and with the second connection terminals being in an aligned contact with said electrode terminals;

bonding the second connection terminals to the electrode terminals;

entirely removing the metal substrate by dissolution with an etchant to expose lead assemblies each composed of the lead having on one end the first connection terminal forming an external connection terminal and, on the other end, the second connection terminal forming an electrode connection terminal bonded to the electrode terminal to support the lead at a distance from and substantially parallel to said electrode terminal carrying surface of the semiconductor chip or the semiconductor wafer.

According to the present invention, there is also provided a process for producing a semiconductor device, comprising the steps of:

preparing a dissolvable metal sheet including a dissolvable metal substrate having throughholes extending therethrough in positions corresponding to those of electrode terminals of a semiconductor chip or a semiconductor wafer; leads formed on one side of the substrate and each having at least one curved portion, a first connection terminal on one end and a second connection terminal on the other end, the first and second connection terminals protruding in opposite directions from said one side of the substrate, the first connection terminals filling the throughholes of the substrate and being exposed from the other side of the substrate, the second connection terminals having a height greater than that of the leads; and the dissolvable metal substrate being dissolvable by an etchant which does not dissolve the leads and the first and second terminals;

placing the metal substrate with said other side being substantially parallel to said electrode terminal carrying surface of said semiconductor chip or the semiconductor wafer and with the first connection terminals exposed from other side being in an aligned contact with said electrode terminals;

bonding the first connection terminals to the electrode terminals;

entirely removing the metal substrate by dissolution with an etchant to expose lead assemblies each composed of the lead having on one end the first connection terminal forming an electrode connection terminal bonded to the electrode terminal to support the lead at a distance from and substantially parallel to said electrode terminal carrying surface of the semiconductor chip or the semiconductor wafer and, on the other end, the second connection terminal forming an external connection terminal.

According to the present invention, there is also provided a probe card for testing a semiconductor chip or a semiconductor wafer having electrode terminals, said probe card comprising:

a card base including an electric circuit having connection terminals exposed from one side of the card base;

probe assemblies each composed of a lead, a probe contact and a bond terminal, said lead extending substantially parallel to said one side of the card base and having at least one curved portion, said probe contact and said bond terminal protruding from one and the other ends of the lead, respectively, in opposite directions toward and away from said one side of the card base, respectively, said bond terminal having a height greater than that of the lead; and the connection terminals of the card base being bonded to the bond terminals of the probe assemblies to support the leads substantially parallel to, and at a distance from, said one side of the card base, said distance corresponding to a difference between heights of the bond terminal and the lead.

DESCRIPTION OF THE PREFERRED EMBODIMENTS

In a preferred embodiment, a semiconductor device is produced by using a substrate of copper as a dissolvable metal in the following process steps according to the present invention.

Figure 2:
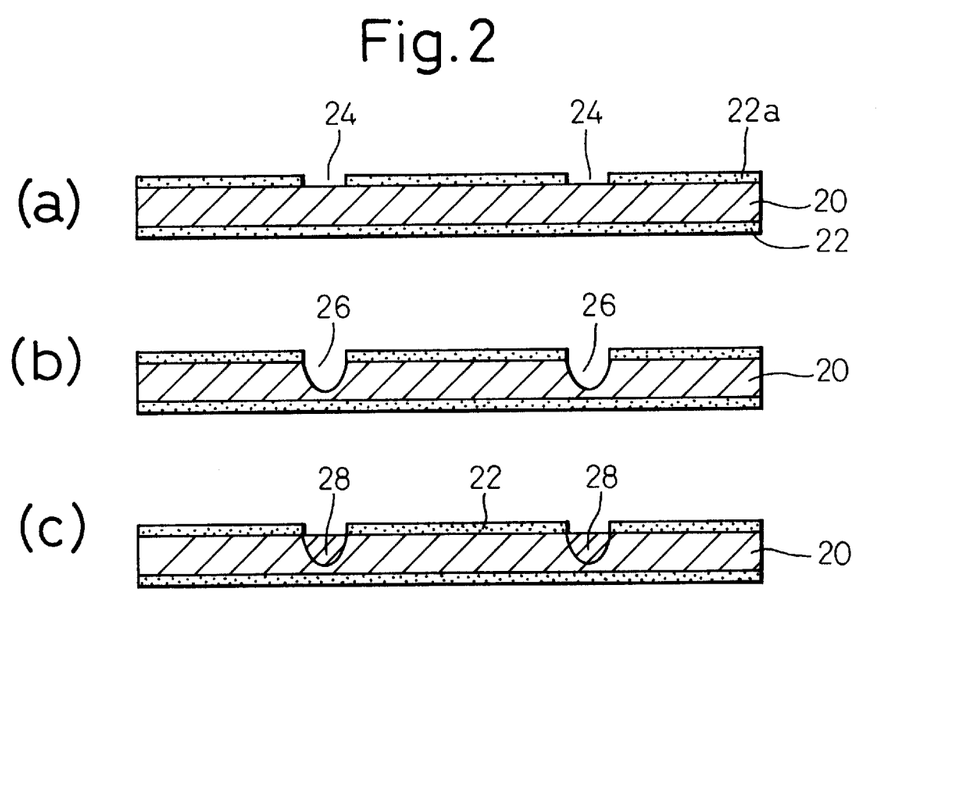
FIGS. 2(a)–2(c) are cross-sectional views showing the process steps of producing a semiconductor device according to the present invention, in the first stage.

FIGS. 2(a)–2(c) show the process steps to form an external connection terminals in a copper substrate 20. In this embodiment, a lead assembly is formed on a semiconductor chip having a passivation film on which an additional conductor wiring pattern is formed to provide arrayed electrode terminals on an electrode terminal carrying surface of the chip. However, it is also possible that a lead assembly is formed on a semiconductor chip having no additional conductor wiring pattern but having electrode terminals directly formed on an electrode terminal carrying surface of the chip.

The term "electrode terminal", used herein not only refers to the electrode terminal directly formed on the electrode terminal carrying surface of a semiconductor chip but also refers to a terminal formed on an extension of the electrode terminal, in which the extension is formed on a passivation film formed on the electrode terminal carrying surface of the semiconductor chip.

FIG. 2(a) shows a process step in which a photosensitive resist layer 22 is formed on both sides of a copper substrate 20 and the resist layer 22 on one side is exposed to light and developed to form a resist pattern 22a having circular openings 24 in which the copper substrate 20 is exposed.

The openings 24 are formed at positions corresponding to those of the connection terminals formed on a passivation film of a semiconductor chip. In this embodiment, the openings 24 have a diameter of 150 μm and are disposed at a pitch of 0.75 mm.

The copper substrate 20 provides a temporary substrate in which a lead assembly is formed by the process steps according to the present invention, and is finally removed by dissolution with a suitable etchant after a semiconductor device having the lead assembly is completed. The copper substrate has a thickness of 0.5 mm to ensure the necessary stiffness.

FIG. 2(b) shows the copper substrate 20 in which concavities 26 are formed at the openings 24. The concavities 26 do not penetrate the copper substrate 20 but have a depth of about 200 μm (0.2 mm).

FIG. 2(c) shows the concavities 26 filled with a plated deposit of gold 28 formed by gold plating with the copper substrate used as a plating current supplier and the resist pattern 22a or a new resist pattern as a plating mask. The plated deposit of gold 28 forms an external connection terminal. In a later step, the copper substrate 20 will be removed by dissolution with a suitable etchant to leave the plated deposit of gold 28 unetched to form an external connection terminal. The plated deposit 28 may be a metal other than gold if the metal can be left unetched while the copper substrate 20 alone can be selectively etched and removed. The plated deposit may be composed of plural plated metals such as nickel, palladium, or solder, instead of a single gold layer.

Figure 3:
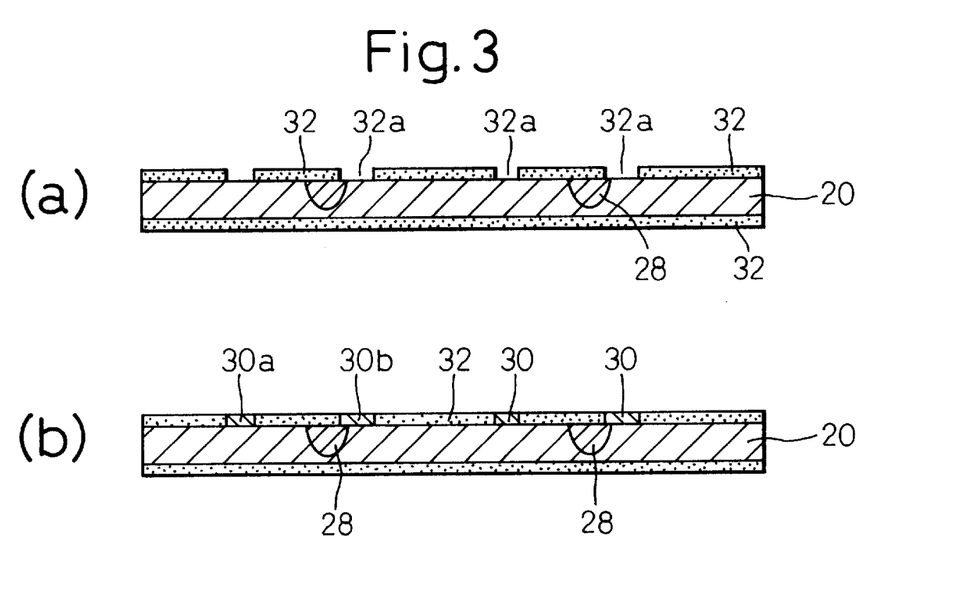
FIGS. 3(a)–3(b) are cross-sectional views showing the process steps of producing a semiconductor device according to the present invention, in the second stage.

FIGS. 3(a) and 3(b) show the process steps to form a lead connecting the external connection terminal 28 and an electrode connection terminal of a semiconductor chip.

FIG. 3(a) shows the copper substrate 20 on which a resist pattern 32 having an exposed portion defining a lead 30 is formed on the substrate 20.

Figure 4:
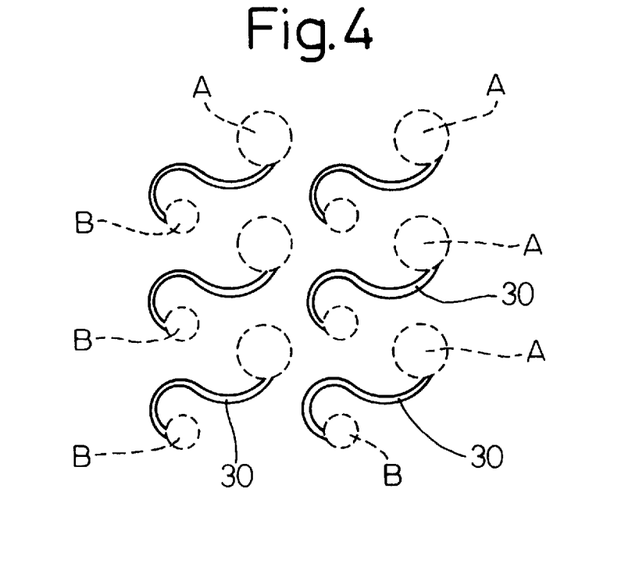
FIG. 4 is a plan view showing lead assemblies according to the present invention.

FIG. 4 shows the resist pattern 32 in plan view, in which the symbol "A" denotes the portions at which external connection terminals are formed and the symbol "B" denotes the portions at which electrode connection terminals are formed. The lead 30 lies in a plane, is S-shaped in plan view, and connects the external connection terminal and the electrode connection terminal.

In FIG. 3(a), the resist pattern has an exposed portion 32a which defines a curved trench in which a metal is deposited by plating to form a lead 30.

A lead 30 is then formed, by an electrolytic plating of gold, with the copper substrate 20 used as a plating current supplier and with the resist pattern 32 as a plating mask. FIG. 3(b) shows a lead 30 formed of a plated deposit of gold in the curved trench 32a of the resist pattern 32. The lead 30 has one end 30a connected to an electrode terminal 12 of a semiconductor chip 10 and the other end 30b connected to the plated deposit of gold or external connection terminal 28. The resist pattern 32 must be formed so that the lead 30 is connected to the plated deposit of gold 28 on the other end 30b to effect electrical connection of the lead 30 to the external connection terminal 28. The resist pattern 32 defines the thickness of the lead 30 and must have a thickness corresponding to that of the lead 30. The lead 30 may be formed of plural plated metal layers, instead of a single gold layer. The lead 30 may be formed of a metal other than gold, if the metal is not dissolved by an etchant which is used to remove the copper substrate 20 by dissolution.

After the lead 30 is formed, an electrode connection terminal 40 is formed to connect the lead 30 to an electrode terminal 12 of a semiconductor chip 10.

Figure 5:
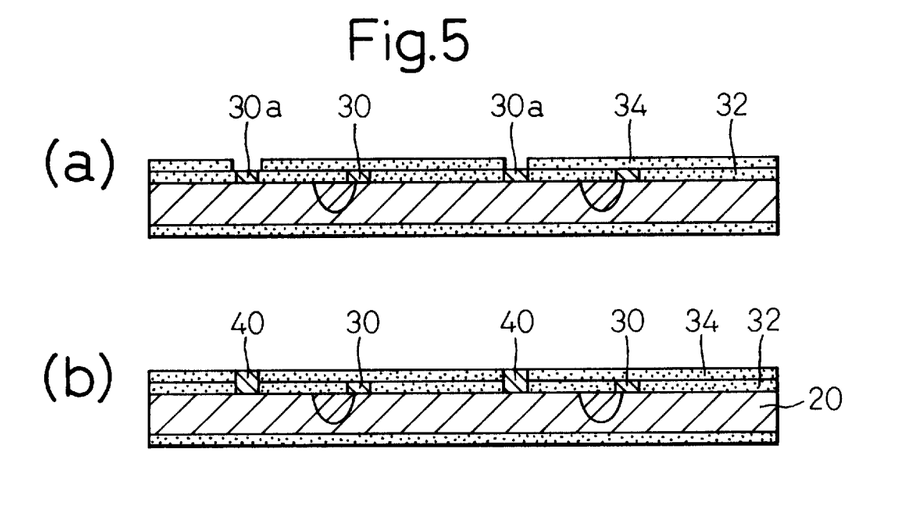
FIGS. 5(a)–5(b) are cross-sectional views showing the process steps of producing a semiconductor device according to the present invention, in the third stage.

FIG. 5(a) shows a process step in which a resist is applied, as the resist pattern 32, to form a resist pattern 34 in which the lead 30 formed in the previous step is exposed only in the upper surface of the one end 30a.

FIG. 5(b) shows an electrode connection terminal 40 formed as a plated deposit of gold on one end 30a of the lead 30, by an electrolytic plating of gold, with the copper substrate 20 used as a plating current supplier and with the resist pattern 34 as a plating mask. The resist pattern 34 ensures formation of the electrode connection terminal 40 having a total thickness greater than that of the lead 30 so that a completed semiconductor device has the lead 30 supported at a distance from the electrode terminal carrying surface thereof. Therefore, the total thickness of the electrode connection terminal 40 is determined based on the above-mentioned distance. The electrode connection terminal 40 may be formed by a plating of solder instead of gold so that it can be bonded to an electrode terminal of a semiconductor chip 10 by soldering.

Figure 6:
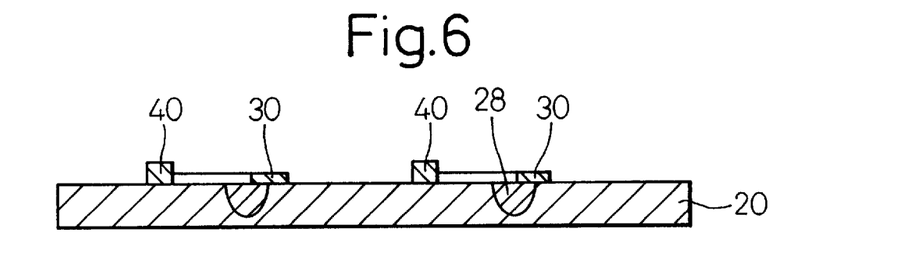
FIG. 6 is a cross-sectional view showing the process step of producing a semiconductor device according to the present invention, in the fourth stage.

After the electrode connection terminal 40 is formed, the resist patterns 32 and 34 are then removed to expose a dissolvable metal sheet as shown in FIG. 6, in which the plated deposit of gold 28 fills the concavity 26 of the copper substrate 20 and is electrically connected to one end of the lead 30 and the electrode connection terminal 40 is formed on the other end of the lead 30.

Figure 7:
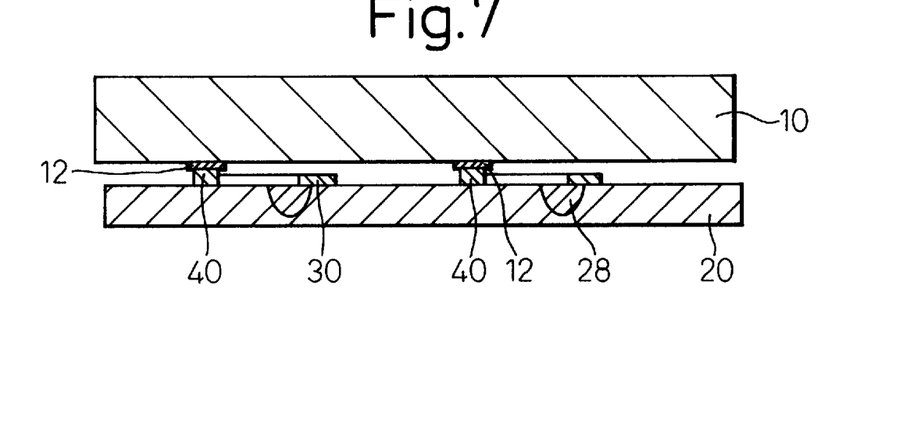
FIG. 7 is a cross-sectional view showing the process step of producing a semiconductor device according to the present invention, in the fifth stage.

The copper substrate 20 having the lead assembly composed of the plated deposit of gold 28, the lead 30 and the electrode connection terminal 40 and a semiconductor chip 10 are then positioned, as shown in FIG. 7, such that electrode terminals 12 of the semiconductor chip 10 are aligned with, and bonded to, the electrode connection terminals 40 of the copper substrate 20. The electrode terminals 12 and the electrode connection terminals 40 can be bonded together in a manner such that, for example, the electrode terminals 12 are preplated with tin and the terminals 12 and 40 are heated and bonded by gold-tin bonding.

The semiconductor chip 10 and the copper substrate 20 are thus bonded with high precision because the lead assemblies, each including the plated deposit of gold 28, the lead 30 and the electrode connection terminal 40 are precisely patterned on, and therefore precisely positioned by, the copper substrate 20 with very small misregistration.

Although the copper substrate 20 is bonded to the semiconductor chip 10 in this embodiment, the copper substrate 20 may be bonded to a semiconductor wafer in which semiconductor chip precursors to be cut into chips are formed. In this case, electrode terminals 12 may be previously formed on a passivation film of the semiconductor wafer and may be aligned with, and bonded to, the electrode connection terminals 40 of the copper substrate 20. The copper substrate 20 having lead assemblies formed thereon ensures high precision bonding, such as bonding to a semiconductor wafer in which high precise positioning is necessary. A semiconductor wafer may not have a terminal on a passivation film and the electrode connection terminal 40 may be directly bonded to an electrode terminal of the chip precursors of the wafer.

Figure 8:
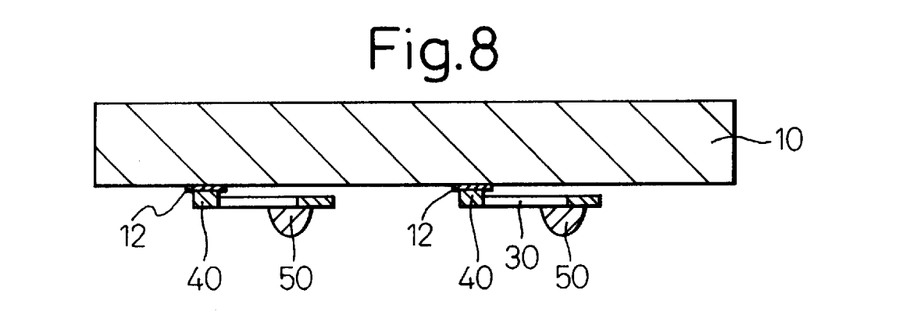
FIG. 8 is a cross-sectional view showing the process step of producing a semiconductor device according to the present invention, in the final stage.

After the electrode connection terminals 40 are bonded to the electrode terminals 12 of the semiconductor chip 10 as shown in FIG. 7, the copper substrate 20 alone is dissolved by an etchant to leave or provide a semiconductor device in which the semiconductor chip 10 has the electrode terminals 12 bonded to the electrode connection terminals 40 and the external connection terminals 50 corresponding to the plated deposit of gold 28 is supported by the lead 30 bonded to the electrode connection terminals 40, as shown in FIG. 8. The selective removal of the copper substrate can be easily effected by etching with an etchant which dissolves copper and does not dissolve gold of the external connection terminal 50, the lead 30 and the electrode connection terminal 40.

The lead 30 lies in a plane and is curved in an S-shape so that it extends from the electrode connection terminal 40 and parallel with an electrode terminal carrying surface of the semiconductor chip 10 and has an external connection terminal 50 in the form of a bump at the tip.

Figure 9:
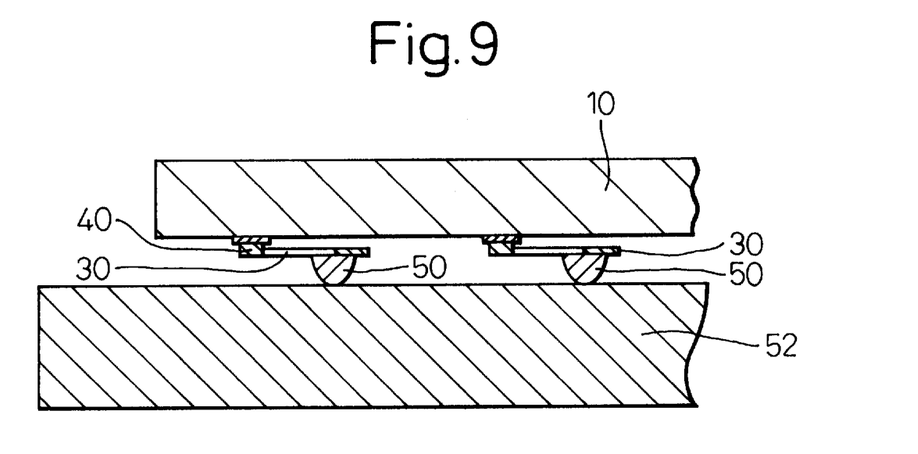
FIG. 9 is a cross-sectional view showing the semiconductor device mounted on a mother board according to the present invention.

FIG. 9 shows the above-produced semiconductor device mounted on a mother board 52. The semiconductor device may be mounted on the mother board 52 by bonding the external connection terminals 50 to the terminals of the mother board 52 using solder reflow process. The thus-mounted semiconductor device is supported by the mother board 52 via the external connection terminals 50, the leads 30 and the electrode connection terminals 40.

The S-shaped lead 30 has a resiliency to mitigate thermal stress occurring between the mother board 52 and the semiconductor chip 10.

Figure 10:
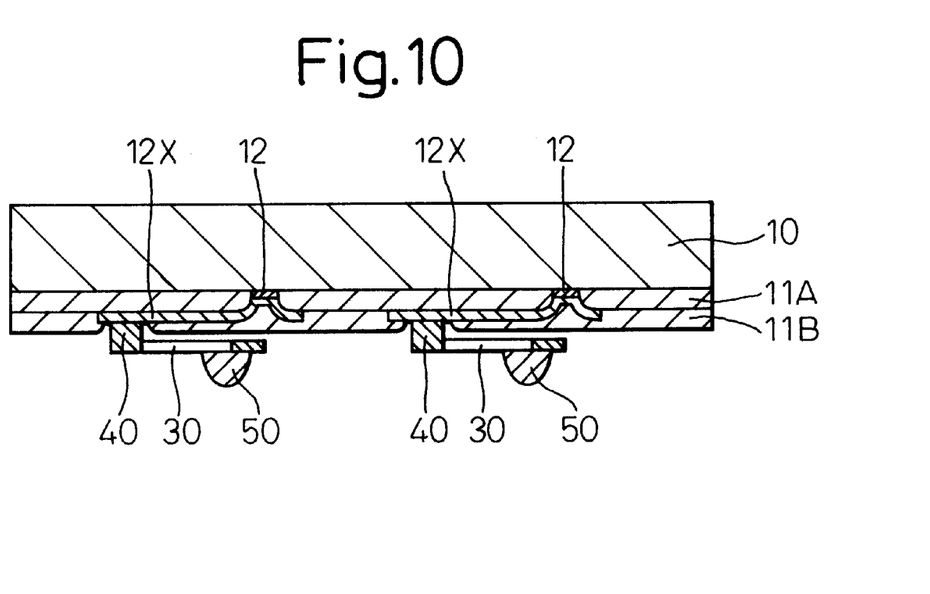
FIG. 10 is a cross-sectional view showing another embodiment of a semiconductor device according to the present invention.

FIG. 10 shows another embodiment of the semiconductor device according to the present invention, in which electrode terminals 12 are indirectly bonded to electrode connection terminals 40 via an extension 12X of the electrodes 12.

The insulation layer 11A of a polyimide or epoxy resin is formed to cover an electrode terminal carrying surface of the semiconductor chip 10 having a passivation film formed thereon to expose the electrode terminals 12. Openings are formed through the insulation layer 11A by laser working to expose the electrode terminal 12. A conductor wiring pattern 12X connected to the electrode terminal 12 is formed on the insulation layer 1 1A by plating or sputtering of copper. A solder resist layer 11B of a polyimide or epoxy resin is then formed over the insulation layer 11A and the conductor wiring pattern 12X except for the portion to be connected to the electrode connection terminal 40.

Figure 11:
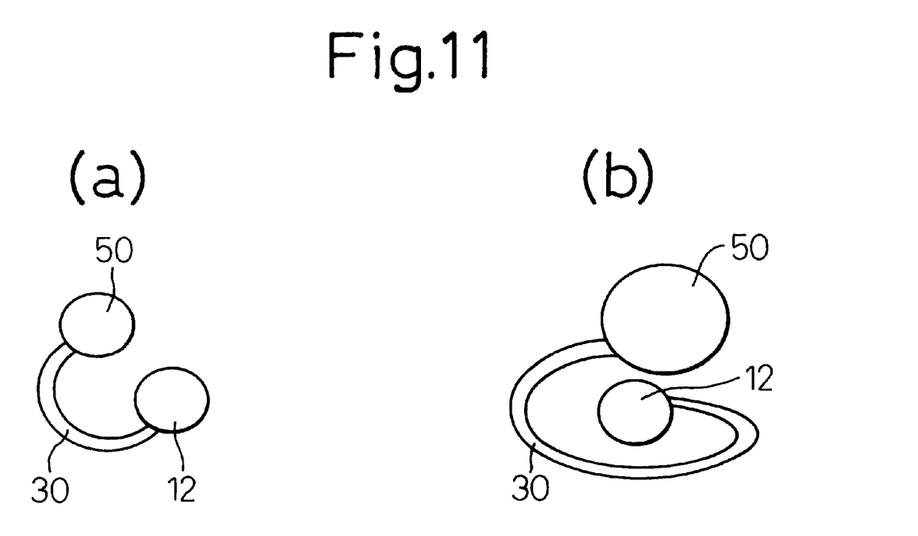
FIGS. 11(a) and 11(b) are plan views showing modified embodiments of lead assemblies according to the present invention.

FIGS. 11(a) and 11(b) show modified lead assemblies having (a) an U-shaped lead and (b) a loop-like shaped lead, respectively. These shapes of leads 30 also have a curved portion to allow three dimensional elastic deformation for mitigating or releasing stresses. The lead 30 can be imparted with any desired shape by a photolithography process using a photosensitive resist. The external connection terminal 50 and the electrode connection terminal 12 may have a diameter designed in accordance with need. In this embodiment, the lead 30 is designed to extend to a distance smaller than a pitch at which the electrode terminals 12 are arranged. This avoids interference between the lead 30 and the terminal 12. It is also possible to select the shape of the lead 30 to avoid interference with the terminal 12.

As described above, the semiconductor device is produced by using a dissolvable metal sheet having a lead assembly. The use of the dissolvable metal sheet enables the precise and reliable semiconductor device to be easily produced, because the lead assemblies are supported by a metal substrate and are therefore arranged in plane with each other, the lead assemblies easily and precisely formed by lithography process, the external connection terminals, the lead and the electrode connection terminals are collectively formed by plating, etc., to provide high productivity, and the semiconductor device having the lead assembly can be easily transported and handled.

FIG. 12(a)–12(d) show a modified process in which the bonding combination is inverted, i.e., the plated deposit of gold 28 is bonded to the electrode terminal 12 of the semiconductor chip 10 and the electrode connection terminal 40 is used as an external connection terminal to be bonded to a mother board.

Figure 12:
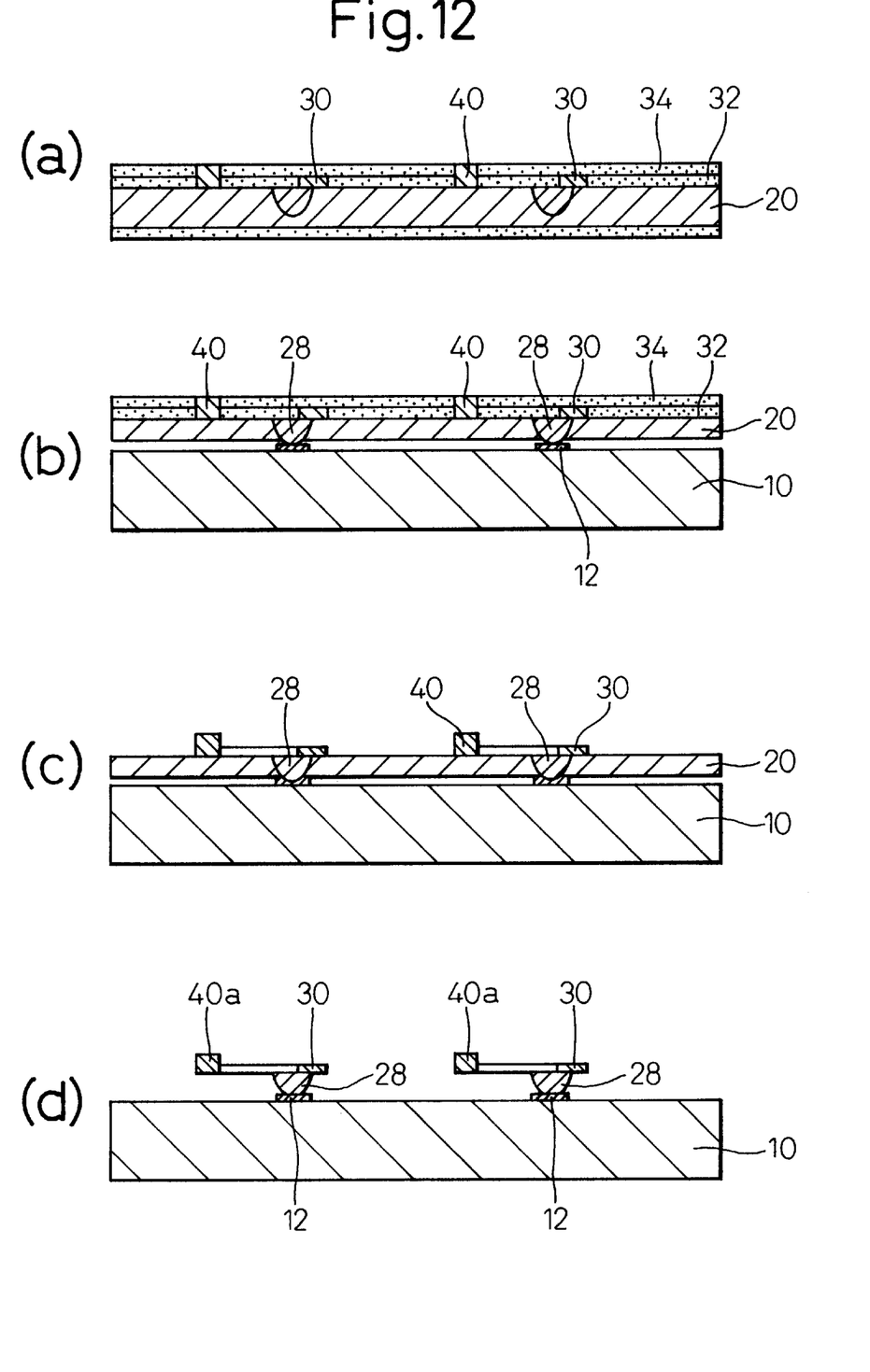
FIGS. 12(a)–12(d) are cross-sectional views showing the process steps of producing a semiconductor device according to another embodiment of the present invention.

FIG. 12(a) shows the same process step as shown in FIG. 4, in which the resist patterns 32 and 34 are formed on the copper substrate 20 and the electrode connection terminal 40 is formed.

FIG. 12(b) shows the next step in which the copper substrate 20 is etched from the side opposite to the side on which the lead 30 and the "electrode connection terminal", 40 are formed, until the copper substrate 20 is made thin to expose the tip of the plated deposit of gold 28 from a fresh surface of the copper substrate 20. The thin copper substrate 20 is then aligned with a semiconductor chip 10 and the electrode terminal 12 of the chip 10 and the plated deposit of gold 28 are bonded together.

In FIG. 12(c), the resist patterns 32 and 34 are then removed.

Finally, as shown in FIG. 12(d), the copper substrate 20 is removed by etching, which is effected to selectively remove the copper substrate 20 while leaving the plated deposit of gold 28, the lead 30 and the electrode connection terminal 40 unetched.

The thus-produced semiconductor device has the plated deposit of gold 28 is bonded to the electrode terminal 12 of the semiconductor chip 10 and the electrode connection terminal 40 is supported by the lead 30, in which the "electrode connection terminal" 40 actually forms an external connection terminal 40a.

Thus, either of the plated deposit of gold 28 and the "electrode connection terminal" 40 of the lead assembly formed on the copper substrate may be used as an external connection terminal, i.e., the roles are interchangeable.

Figure 13:
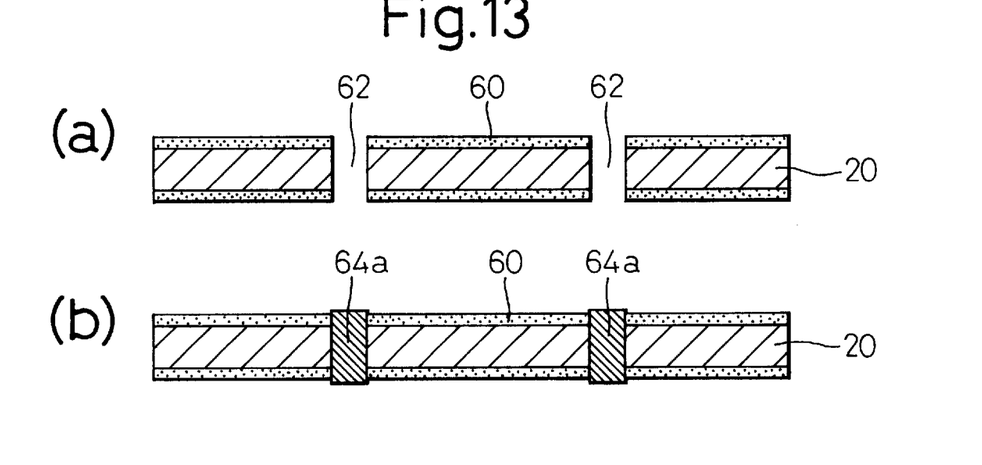
FIGS. 13(a)–13(b) are cross-sectional views showing the process steps of producing a semiconductor device according to a further embodiment of the present invention, in the first stage.
Figure 14:
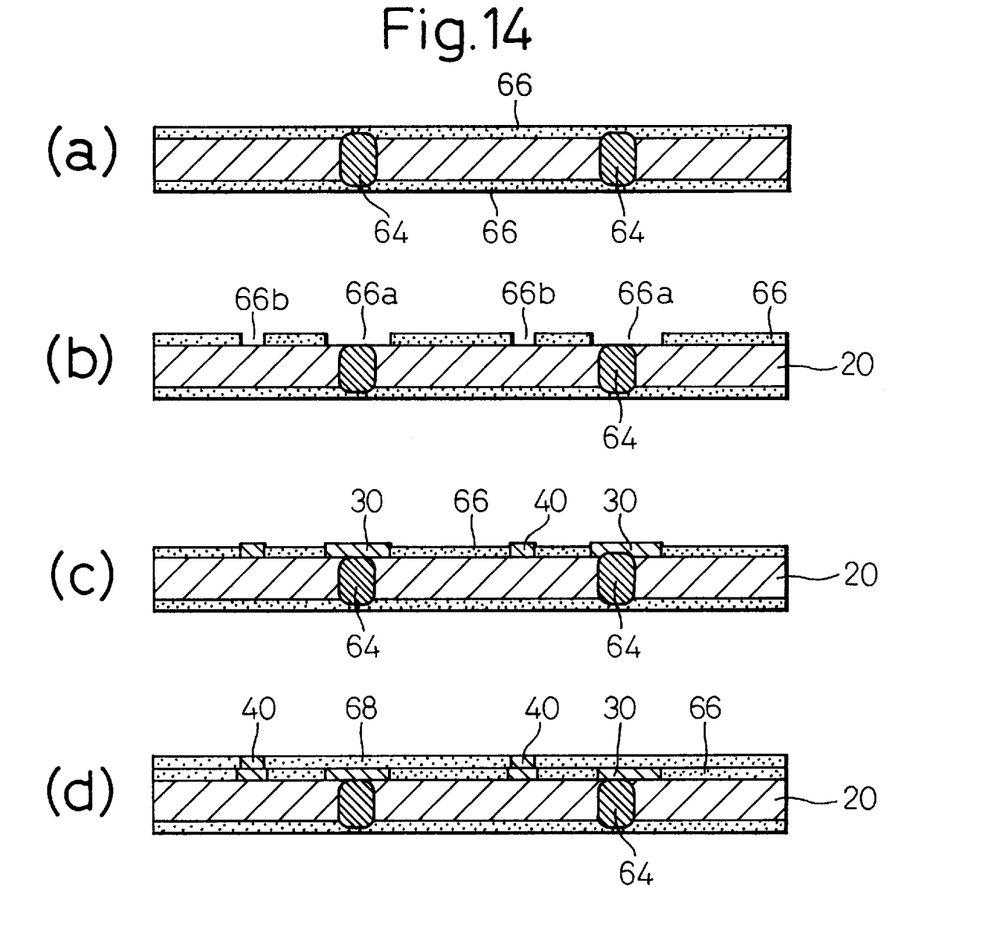
FIGS. 14(a)–14(d) are cross-sectional views showing the process steps of producing a semiconductor device according to the further embodiment of the present invention, in the second stage.
Figure 15:
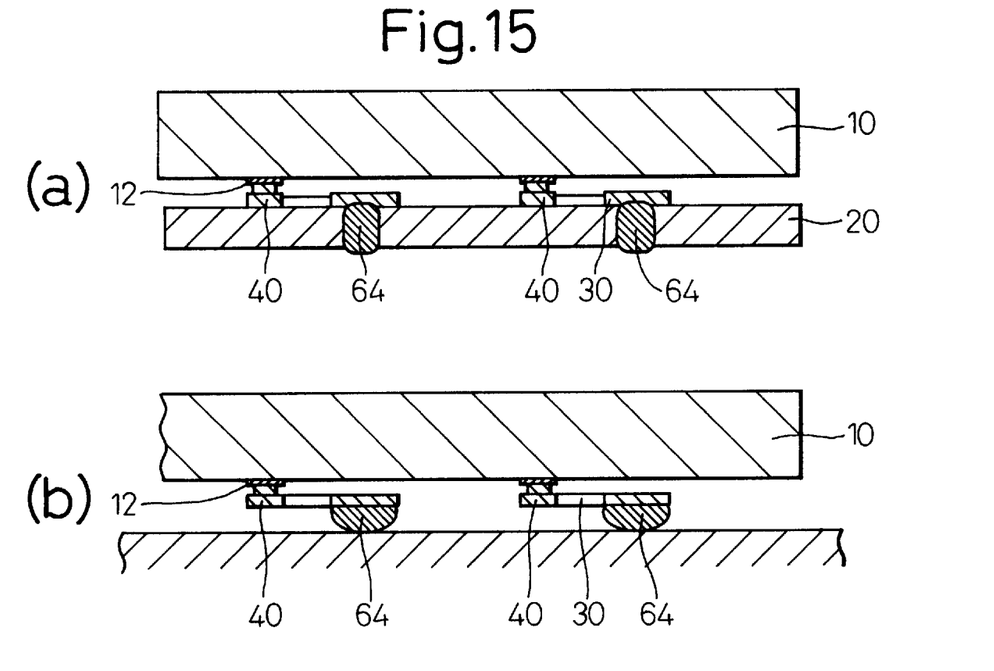
FIGS. 15(a)–15(b) are cross-sectional views showing the process steps of producing a semiconductor device according to the further embodiment of the present invention, in the final stage.

FIGS. 13 to 15 show another embodiment of the process of producing a semiconductor device according to the present invention. In this embodiment, a low melting point metal is used to form an external connection terminal.

FIG. 13(a) shows a process step in which a copper substrate 20 is coated with a resist 60 on both sides and throughholes 62 are then formed in the positions at which external connection terminals are formed.

FIG. 13(b) shows the next step in which a paste 64a of a low melting point metal such as solder is filled in the throughholes 62 and is then reflowed. Because the filled paste 64a is reduced in volume when reflowed, the paste 64a is filled in the throughholes 62 to a thickness greater than that of the copper substrate 20.

FIG. 14(a) shows that, after the paste 64a is reflowed, the resist 60 is removed and another resist 66 for patterning is formed. The symbol 64 denotes the reflowed low melting point metal.

As shown in FIG. 14(b), the resist 66 is patterned to define a pattern 66a of a lead 30 and a pattern 66b of an electrode connection terminal 40. It is the same as in the preceding embodiment that the lead 30 lies in a plane and has a curved portion.

In the next step, as shown in FIG. 14(c), the lead 30 is formed at the exposed portions 66a and 66b by plating of gold with the copper substrate 20 used as a plating current supplier.

FIG. 14(d) shows the next step in which an electrode connection terminal 40 thicker than the lead 30 is formed by forming a further resist layer 68 on the resist layer 66, patterning the resist layer 68 to expose the portion of the lead 30 on which the electrode connection terminal 40 is formed, and electrolytically plating the exposed portion of the lead 30. The resist layer 66 and 68 are then removed to leave the copper substrate 20 having a lead assembly. An external connection terminal is usually provided by the low melting point metal 64 filled in the throughhole 62 of the copper substrate 20.

FIGS. 15(a) and 15(b) show the process steps of producing a semiconductor device by bonding a semiconductor chip to the above-prepared copper substrate 20 having a lead assembly. FIG. 15(a) shows a step in which the electrode terminals 12 of the semiconductor chip 10 and the electrode connection terminals 40 of the lead assembly are aligned and bonded together. FIG. 15(b) shows a step in which the copper substrate is removed by etching to provide a semiconductor device, in which the external connection terminals 64 are also etched somewhat and flattened. When the external connection terminals 64 are composed of a low melting point metal such as a high melting point solder, the semiconductor device can be mounted on a mother board by using a low melting point solder.

It is also possible, in this embodiment, that the external connection terminals 64 and the electrode connection terminals 40 may be inversely bonded to the semiconductor chip 10 so that the "external connection terminals" 64 are actually bonded to the electrode terminals 12 of the semiconductor chip 10 and the "electrode connection terminals" 40 are actually used as an external connection terminals.

This embodiment also ensures that the lead 30 mitigates thermal stress or other stresses occurring during mounting of the semiconductor device onto a mother board, because the external connection terminals are connected to the semiconductor chip 10 via the lead 30.

The present invention also provides a probe card for testing a semiconductor chip or a semiconductor wafer.

Figure 16:
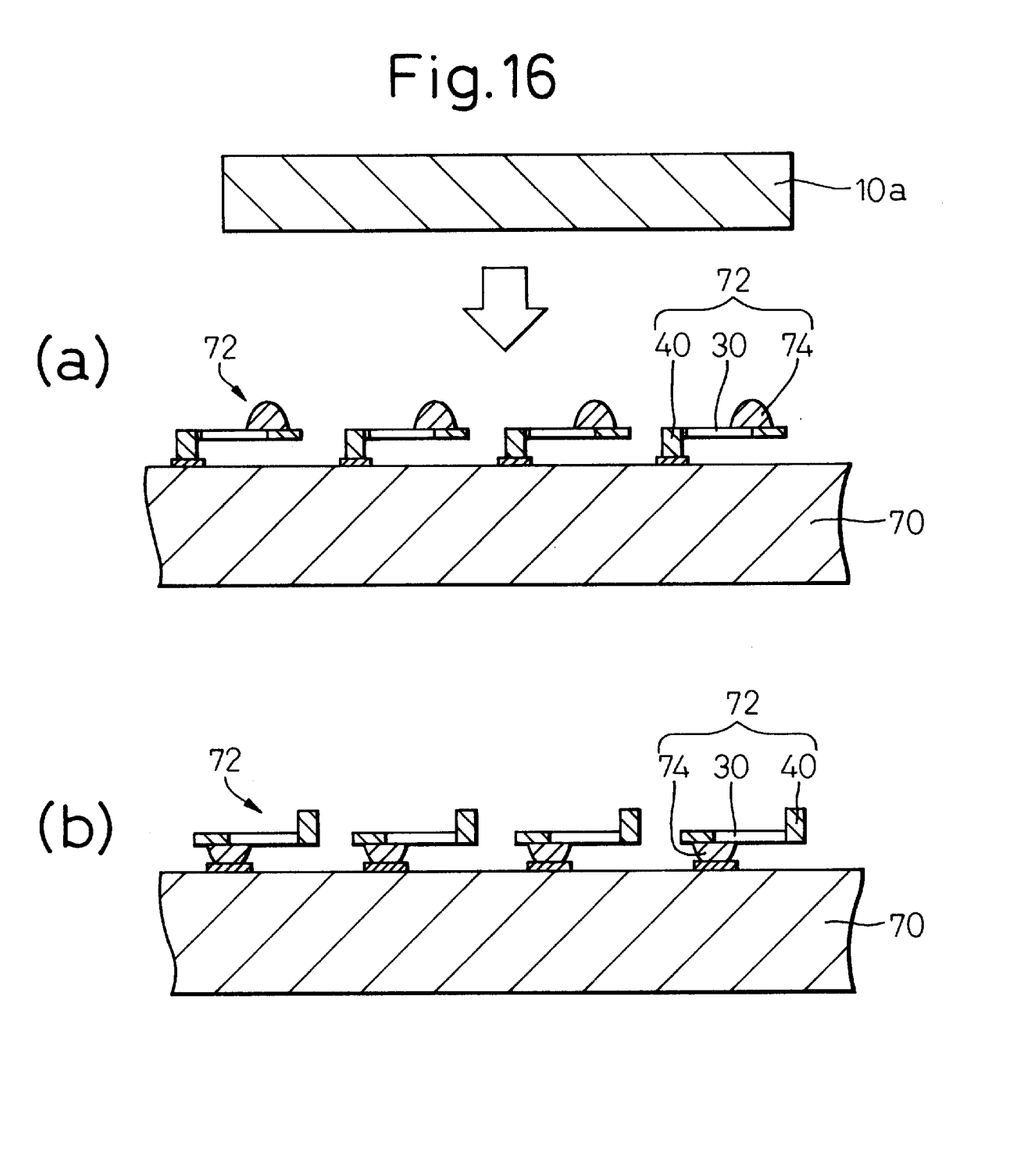
FIGS. 16(a)–16(b) are cross-sectional views showing two embodiments of probe cards according to the present invention.

FIG. 16(a) shows a probe card produced by utilizing a lead assembly including a lead connecting an external connection terminal and an electrode connection terminal. The probe card has a card base 70 having lead assemblies or probes 72 bonded thereto. A probe 72 is composed of a lead 30, an electrode connection terminal 40 and an external connection terminal or a probe contact 74 which are formed in the same manner as the lead assembly shown in FIG. 6.

Specifically, a copper substrate 20 having a lead 30, an electrode connection terminal 40 and a probe contact 74 is prepared, the copper substrate 20 is then bonded to the card base 70 with the electrode connection terminals 40 being aligned with terminals on the card base 70, and the copper substrate 20 is selectively removed by etching to provide a probe card having a card base 70 on which a series of probes 72 are mounted.

The probe contact 74 is formed of a conducting metal such as a plated deposit of gold used for forming an external connection terminal in the preceding embodiments. The resiliency of the lead 30 is utilized to press the probe contact 74 against the electrode terminals of a semiconductor chip 10 or a semiconductor wafer to test the chip or wafer.

The probes 72 must be arranged on the card base 70 in the positions corresponding to the contact positions (positions of the electrode terminals) of the semiconductor chip 10a or a wafer. The probes 72 can be precisely positioned on the card base 70 without misregistration of the probe contacts 74 because the probes 72 supported in position by the copper substrate 20 are aligned with, and bonded to, the terminals on the card base 70.

The roles of the electrode connection terminal 40 and the plated deposit of a metal 74 are exchangeable as shown in FIG. 16(b), in which the "electrode connection terminal" 40 actually forms a probe contact and the plated deposit of gold 74 is bonded to the terminal of the card base 70.

As herein described, the present invention provides a semiconductor device in which thermal or other stresses can be mitigated by a lead assembly including a curved lead. The present invention provides a process of producing a semiconductor device, particularly a chip size package, in which the lead assemblies are precisely and efficiently bonded to a semiconductor chip or a semiconductor wafer by using a dissolvable metal sheet which is also provided by the present invention.

What is claimed is:

1. A process of producing a dissolvable metal sheet suitably applicable to production of semiconductor devices, comprising the steps of:

forming, on one side of a dissolvable metal substrate, a plurality of concavities in positions corresponding to those of electrode terminals of a semiconductor chip or a semiconductor wafer;

filling the concavities with first plated deposits of a first metal;

forming leads on said one side of the substrate, said leads lying on said one side of the substrate and each having at least one curved portion and bonded on one end to at least one of the first plated deposits; and forming, on the other end of the leads, a plurality of second plated deposits of a second metal having a height greater than that of the leads.

2. The process of claim 1 wherein the dissolvable metal comprises copper, and wherein the first and second metals comprise one or more of gold, nickel, palladium, and solder.

3. The process of claim 1 wherein the dissolvable metal substrate has a thickness of about 0.5 mm and wherein the concavities have a depth of about 0.2 mm.

4. The process of claim 1 wherein the forming leads on said one side of the substrate includes applying a photosensitive resist layer on the substrate; exposing the resist layer to form a resist pattern that defines the boundary of each lead such that within the boundary is at least a portion of a first plated deposit; and plating one or more metals within the pattern to form the lead.

5. The process of claim 4 wherein the plating of one or more metals is by electroplating with the substrate used as a plating current supplier and with the resist pattern a s a plating mask.

6. A process of producing a dissolvable metal sheet suitably applicable to production of semiconductor devices, comprising the steps of:

forming throughholes extending through a dissolvable metal substrate in positions corresponding to those of electrode terminals of a semiconductor chip or a semiconductor wafer;

filling the throughholes with a low melting point metal;

forming leads on one side of the substrate, said leads lying on said one side of the substrate and each having at least one curved portion and bonded on one end to the low melting point metal filled in the throughholes; and forming, on the other end of the leads, a plated deposit of a metal having a height greater than that of the leads.

7. The process of claim 6 wherein the dissolvable metal comprises copper, and wherein the low melting point metal comprises one or more of gold, tin, or solder.

8. The process of claim 6 wherein the forming leads on said one side of the substrate includes applying a photosensitive resist layer on the substrate; exposing the resist layer to form a resist pattern that defines the boundary of each lead such that within the boundary is at least a portion of the first plated deposit; and plating one or more metals within the pattern to form the lead so that the lead contacts the low melting point metal.

9. A process for producing a semiconductor device, comprising the steps of:

preparing a dissolvable metal sheet including a dissolvable metal substrate having concavities on one side in positions corresponding to those of electrode terminals formed on an electrode terminal carrying surface of a semiconductor chip or a semiconductor wafer; and leads lying on said one side of the substrate and each having at least one curved portion, a first connection terminal on one end and a second connection terminal on the other end, the first and second connection terminals protruding in opposite directions from said one side of the substrate, the first connection terminals filling the concavities of the substrate, the second connection terminals having a height greater than that of the leads; the dissolvable metal substrate being dissolvable by an etchant which does not dissolve the leads and the first and second terminals;

placing the metal substrate with said one side being substantially parallel to said electrode terminal carrying surface of the semiconductor chip or the semiconductor wafer and with the second connection terminals being in an aligned contact with said electrode terminals;

bonding the second connection terminals to the electrode terminals;

entirely removing the metal substrate by dissolution with an etchant to expose lead assemblies each composed of the lead having on said one end the first connection terminal forming an external connection terminal and, on said other end, the second connection terminal forming an electrode connection terminal bonded to the electrode terminal to support the lead at a distance from and substantially parallel to said electrode terminal carrying surface of the semiconductor chip or the semiconductor wafer.

10. The process of claim 9 wherein the dissolvable metal substrate comprises copper with a thickness of about 0.5 mm and wherein the concavities have a depth of about 0.2 mm.

11. The process of claim 9 wherein the leads on said one side of the substrate are formed by applying a photosensitive resist layer on the substrate; exposing the resist layer to form a resist pattern that defines the boundary of each lead such that within the boundary is at least a portion of the first plated deposit; and plating one or more metals within the pattern.

12. The process of claim 9 wherein the leads have a resiliency to mitigate stress occurring between the semiconductor chip or semiconductor wafer and the external connection terminals.

13. A process for producing a semiconductor device, comprising the steps of:

preparing a dissolvable metal sheet including a dissolvable metal substrate having concavities on one side in positions corresponding to those of electrode terminals formed on an electrode terminal carrying surface of a semiconductor chip or a semiconductor wafer; and leads lying on said one side of the substrate and each having at least one curved portion, a first connection terminal on one end and a second connection terminal on the other end, the first and second connection terminals protruding in opposite directions from said one side of the substrate, the first connection terminals filling the concavities of the substrate, the second connection terminals having a height greater than that of the leads; the dissolvable metal substrate being dissolvable by an etchant which does not dissolve the leads and the first and second terminals;

partially removing the metal substrate by dissolution with an etchant from the other side of the substrate until the first connection terminals are partially exposed;

placing the metal substrate with said one side being substantially parallel to said electrode terminal carrying surface of the semiconductor chip or the semiconductor wafer and with the partially exposed first connection terminals being in an aligned contact with said electrode terminals;

bonding the first connection terminals to the electrode terminals; and entirely removing the metal substrate by further dissolution with an etchant to expose lead assemblies each composed of the lead having on said one end the first connection terminal forming an electrode connection terminal bonded to the electrode terminal to support the lead at a distance from and substantially parallel to said electrode terminal carrying surface of the semiconductor chip or the semiconductor wafer and, on said other end, the second connection terminal forming an external connection terminal.

14. The process of claim 13 wherein the dissolvable metal sheet has a thickness of about 0.5 mm and wherein the concavities have a depth of about 0.2 mm.

15. The process of claim 13 wherein the second connection terminal comprises one or more of gold, nickel, palladium, and solder.

16. The process of claim 13 wherein the first connection terminal comprises gold.

17. A process for producing a semiconductor device, comprising the steps of:

preparing a dissolvable metal sheet including a dissolvable metal substrate having throughholes extending therethrough in positions corresponding to those of electrode terminals of a semiconductor chip or a semiconductor wafer; leads formed on one side of the substrate and each having at least one curved portion, a first connection terminal on one end and a second connection terminal on the other end, the first and second connection terminals protruding in opposite directions from said one side of the substrate, the first connection terminals filling the throughholes of the substrate, the second connection terminals having a height greater than that of the leads; and the dissolvable metal substrate being dissolvable by an etchant which does not dissolve the leads and the first and second terminals;

placing the metal substrate with said one side thereof being substantially parallel to said electrode terminal carrying surface of said semiconductor chip or the semiconductor wafer and with the second connection terminals being in an aligned contact with said electrode terminals;

bonding the second connection terminals to the electrode terminals;

entirely removing the metal substrate by dissolution with an etchant to expose lead assemblies each composed of the lead having on one end the first connection terminal forming an external connection terminal and, on the other end, the second connection terminal forming an electrode connection terminal bonded to the electrode terminal to support the lead at a distance from, and substantially parallel to, said electrode terminal carrying surface of the semiconductor chip or the semiconductor wafer.

18. The process of claim 17 wherein the dissolvable metal sheet comprises copper and has a thickness of about 0.5 mm, and wherein the throughholes have a diameter of about 0.15 mm.

19. A process for producing a semiconductor device, comprising the steps of:

preparing a dissolvable metal sheet including a dissolvable metal substrate having throughholes extending therethrough in positions corresponding to those of electrode terminals of a semiconductor chip or a semiconductor wafer; leads formed on one side of the substrate and each having at least one curved portion, a first connection terminal on one end and a second connection terminal on the other end, the first and second connection terminals protruding in opposite directions from said one side of the substrate, the first connection terminals filling the throughholes of the substrate and being exposed from the other side of the substrate, the second connection terminals having a height greater than that of the leads; and the dissolvable metal substrate being dissolvable by an etchant which does not dissolve the leads and the first and second terminals;

placing the metal substrate with said other side being substantially parallel to said electrode terminal carrying surface of said semiconductor chip or the semiconductor wafer and with the first connection terminals exposed from other side being in an aligned contact with said electrode terminals;

bonding the first connection terminals to the electrode terminals;

entirely removing the metal substrate by dissolution with an etchant to expose lead assemblies each composed of the lead having on one end the first connection terminal forming an electrode connection terminal bonded to the electrode terminal to support the lead at a distance from and substantially parallel to said electrode terminal carrying surface of the semiconductor chip or the semiconductor wafer and, on the other end, the second connection terminal forming an external connection terminal.

20. The process of claim 19 wherein the dissolvable metal sheet comprises copper and has a thickness of about 0.5 mm.

* * * * *